United States Patent [19]

Rich

[11] Patent Number: 5,168,218
[45] Date of Patent: Dec. 1, 1992

[54] TRAY-TO-TRAY CIRCUIT PACKAGE HANDLER

[76] Inventor: Donald S. Rich, 15 Buttonwood Dr., Long Valley, N.J. 07853

[21] Appl. No.: 702,806

[22] Filed: May 17, 1991

Related U.S. Application Data

[63] Continuation-in-part of Ser. No. 532,253, Jun. 1, 1990, Pat. No. 5,065,089.

[51] Int. Cl.[5] .................... G01R 31/02; B07C 5/344
[52] U.S. Cl. .................. 324/158 F; 209/573; 324/73.1
[58] Field of Search ............ 324/158 F, 158 P, 73.1; 209/573; 901/40; 198/394; 414/730, 737

[56] References Cited

U.S. PATENT DOCUMENTS

| | | | |
|---|---|---|---|
| 4,733,459 | 3/1988 | Tateno | 209/573 |
| 4,770,599 | 9/1988 | Hawkswell | 901/40 |
| 4,908,126 | 3/1990 | Willberg et al. | 324/158 F |
| 4,997,552 | 3/1991 | Schlinkmann et al. | 901/40 |
| 5,023,544 | 6/1991 | Vallone et al. | 209/573 |

Primary Examiner—Ernest F. Karlsen
Attorney, Agent, or Firm—Rohm & Monsanto

[57] ABSTRACT

A handler system for transferring circuit packages, such as integrated circuits, from a tray containing a batch of the integrated circuits to a testing socket at a test site enjoys the advantages of high precision placement of the integrated circuit in the testing socket to achieve greatly reduced lead bending and damage to the integrated circuit body. Such precision is achieved by a simple mechanism wherein the travel of the integrated circuit from the tray to the test site and back to a selectable one of the good tray and the reject tray is performed exclusively along a single axis of movement of a carrier. The linear bidirectional motion of the carrier is limited to the z-axis, and eliminates misalignment which might result from wear of a ball screw and nut. The system is controlled by a computer which contains in its memory information relating to the dimensions of the trays and the types of circuit packages which are to be tested.

20 Claims, 2 Drawing Sheets

TRAY-TO-TRAY CIRCUIT PACKAGE HANDLER

Relationship to Other Application

This application is a continuation-in-part patent application of U.S. Ser. No. 532,253, which was filed on Jun. 1, 1990, now U.S. Pat. No. 5,065,089, the disclosure of which is incorporated herein by reference.

Background of the Invention

This invention relates generally to systems and arrangements for handling and testing packaged circuits, such as hybrid and integrated circuits, and more particularly, to a system which achieves high alignment precision so as virtually to eliminate the bending of circuit leads due to backlash and misalignment, by removing a circuit package to be tested from a tray, testing same, and returning the circuit package to a selectable one of a pair of trays, while moving the circuit package along only one axis of movement.

Integrated circuit and hybrid circuit handling systems have been employed for a number of years to facilitate testing of the devices in controlled environmental conditions, in automatic and semiautomatic modes. Of course, the testing of such electrical devices can be achieved in a manual system, but the throughput would be quite low, typically on the order of one or two units per minute. Fully automatic systems, however, are generally quite large, complex, and expensive. They are not readily adaptable to changes in the design of the circuit packages, but can achieve very high throughput.

There is a need in this industry for a handler arrangement which can achieve throughput rates on the order of a hundred or more electrical or electronic circuit packages tested per hour, while achieving low initial cost, simplicity of construction, high modularity for ready adaptability to variations in the physical configuration of the devices to be tested, adaptability to the specific working and testing environment of the user, and compactness.

It is, therefore, an object of this invention to provide a simple, economical, and compact handler system for electrical devices, such as integrated and hybrid circuits, which achieve high accuracy in the insertion of the leads of the electrical devices into the test socket.

It is another object of this invention to provide a handler system for packaged electrical devices, wherein the devices are sequentially plugged into a tester, without misalignment caused by drift.

It is also an object of this invention to provide a handler system for packaged electrical circuits wherein batches of such packaged circuits can be tested sequentially.

It is a further object of this invention to provide a handler system which can remove from a batch of electrical circuit packages defective ones of such packages and incorporate such defective packages into a predetermined batch of defective units.

It is additionally an object of this invention to provide a circuit handler system which can easily and economically be configured to test batches of packaged electrical circuits of different dimensions.

It is yet a further object of this invention to provide a circuit handler system which does not unduly stress the packaging of integrated circuits.

It is also another object of this invention to provide a circuit handler system which can easily be serviced.

It is yet an additional object of this invention to provide a circuit handler system which can be arranged to accommodate a variety of different manipulators thereunder.

It is still another object of this invention to provide a circuit handler system which positively ejects the circuit packages, such as integrated circuit packages, from the system.

SUMMARY OF THE INVENTION

The foregoing and other objects are achieved by this invention which provides, in a system aspect of the invention, a circuit handler which provides an electrical device to a test site where it is subjected to a test procedure. In accordance with the invention, a programmable horizontal platform supports a tray which contains a plurality of the electrical devices. The programmable horizontal platform is controllably movable in a substantially horizontal plane along first and second axes of motion. A carrier, which moves exclusively along a third axis of motion, which is transverse to the first and second axes of motion, is provided for removing the electrical device from the tray, delivering same to a testing arrangement, and returning same. The test arrangement communicates electrically with the electrical devices, and is arranged in the vicinity of the third axis of motion on the other side of the programmable horizontal platform from the tray. The test arrangement has associated therewith an electrical contact for effecting the electrical communication. Of course, in other embodiments, any number of desired contacts can be provided. Finally, a holder, which is coupled to the carrier means, is provided for engaging with the electrical devices, and maintaining engagement with same during conveyance of the electrical devices from the tray to the test arrangement.

In one embodiment, a computer system is provided which has a memory for containing information corresponding to the dimensions of the tray, and the subdivisions thereof where the electrical devices are located. The computer is provided with input-output capability for enabling a human operator to communicate with a computer, and verify that the operation of the system is in conformance with a desired particular arrangement of dimensions of the tray. The motion of the platform substantially within a horizontal plane is achieved by a drive system which is controlled by the computer, and which is formed, in certain embodiments, of at least one linear stepping motor. In a preferred embodiment, an additional drive is provided to permit two dimensional motion of the platform within the horizontal plane. A further drive, of course, is provided for the carrier so as to enable its being displaced along the third axis.

In a further embodiment, the computer is provided with additional memory for containing information corresponding to the dimensions of a reject tray, and the subdivisions therein, where electrical devices which failed the test procedure, or are otherwise rejected, are delivered. Thus, the travel of the horizontal platform after the test is responsive to the results of the test. It should be noted that the tray selection in not necessarily limited to be responsive to a test failure, since other parameters of the device under test might render it desirable to be included in a separate category.

In a highly advantageous embodiment of this system aspect of the invention, the circuit handler is provided with a subcarrier which is coupled to the carrier, for displacing the holder with respect thereto. Thus, the carrier travels to the vicinity of the circuit package to be engaged, and the subcarrier, illustratively, with a vacuum chuck, with applies a suction force to attract the electrical device to be tested.

In accordance with a first method aspect of the invention, the method comprises the steps of:

first moving a first tray containing a batch of the circuit packages to be tested in a substantially horizontal plane until a first location of the first tray which contains a first selected circuit package to be tested is disposed in a transverse path of travel of a carrier, the path of travel of the carrier being transverse to the substantially horizontal plane;

first displacing the carrier along the transverse path of tra in a direction toward the substantially horizontal plane;

engaging the first selected circuit package to be tested with the carrier;

second displacing the carrier with the first engaged circuit package along the transverse path of travel in a direction away from the substantially horizontal plane;

second moving the first tray whereby it is clear of the transverse path of travel;

third displacing the carrier with the first engaged circuit package along the transverse path of travel in a direction toward the substantially horizontal plane and to an extent beyond the intersection of the transverse path of travel and the substantially horizontal plane, and to the vicinity of a test arrangement;

first urging the first engaged circuit package into communication with the test arrangement;

second urging the first engaged circuit package to be released from the test arrangement; and fourth displacing the carrier with the engaged circuit package along the transverse path of travel in a direction toward the substantially horizontal plane and to an extent beyond the intersection of the transverse path of travel and the substantially horizontal plane.

In a specific illustrative embodiment of the invention, the first tray is moved a third time such that the first location is interposed in the transverse path of travel. The carrier then is displaced a fourth time with the first engaged circuit package installed thereon, toward the substantially horizontal plane. Subsequently, the first engaged circuit package is deposited into the first location of the first tray.

In an alternative situation, such as where it is determined by the testing procedure that the tested electrical device is rejected or is otherwise to be included in a second category, a second tray is provided, illustratively on the movable platform, and it is moved such that a first location of the second tray is interposed in the transverse path of travel of the carrier. This time, the fourth displacement of the carrier with the first engaged circuit package coupled thereto travels along the transverse path of travel to a point just short of the substantially horizontal plane on which the second tray is disposed. The first engaged circuit package is then deposited into the first location of the second tray.

In some embodiments, it is desirable to hold the engaged circuit package during performance of the test procedure. This, in combination with the fact that the carrier travels only along a single axis of travel, ensures that misalignment and backlash are minimized resulting in a more definite engagement between the circuit package and the test arrangement, and minimization of the probability of bending the electrical leads of the package.

In accordance with a second method aspect of the invention, the operation of a circuit package handler system for testing batches of circuit packages includes the steps of:

first moving a platform having a first category tray containing a plurality of circuit packages to be tested and a second category tray containing spaces for accommodating ones of the plurality of circuit packages which are determined after the performance of the test thereon to belong in a second category;

removing a selected circuit package from the first category tray along a single axis of travel;

delivering the selected circuit package to a test station by moving same along the single axis of travel;

returning the selected circuit package to a selected one of the first category tray and the second category tray along the single axis of travel, the selection between the first category tray and the second category tray being made in response to a result obtained from the test performed at the test station.

As previously noted, the step of removing the selected circuit package from the first category tray includes the further step of engaging the circuit package with a vacuum chuck. Again, the vacuum chuck may be installed on a subcarrier which has a short extension arm which extends for approximately one inch, so as to bridge the gap between the carrier and the circuit package. In addition to the foregoing process steps, the invention includes a step of moving a holder arm which is installed on the moving platform for securing the first category and second category trays thereto. Thus, the trays will not move on the platform as it is displaced by operation of the computer driven displacement system.

BRIEF DESCRIPTION OF THE DRAWING

Comprehension of the invention is facilitated by reading the following detailed description, in conjunction with the annexed drawing, in which.

DETAILED DESCRIPTION

Figure 1:
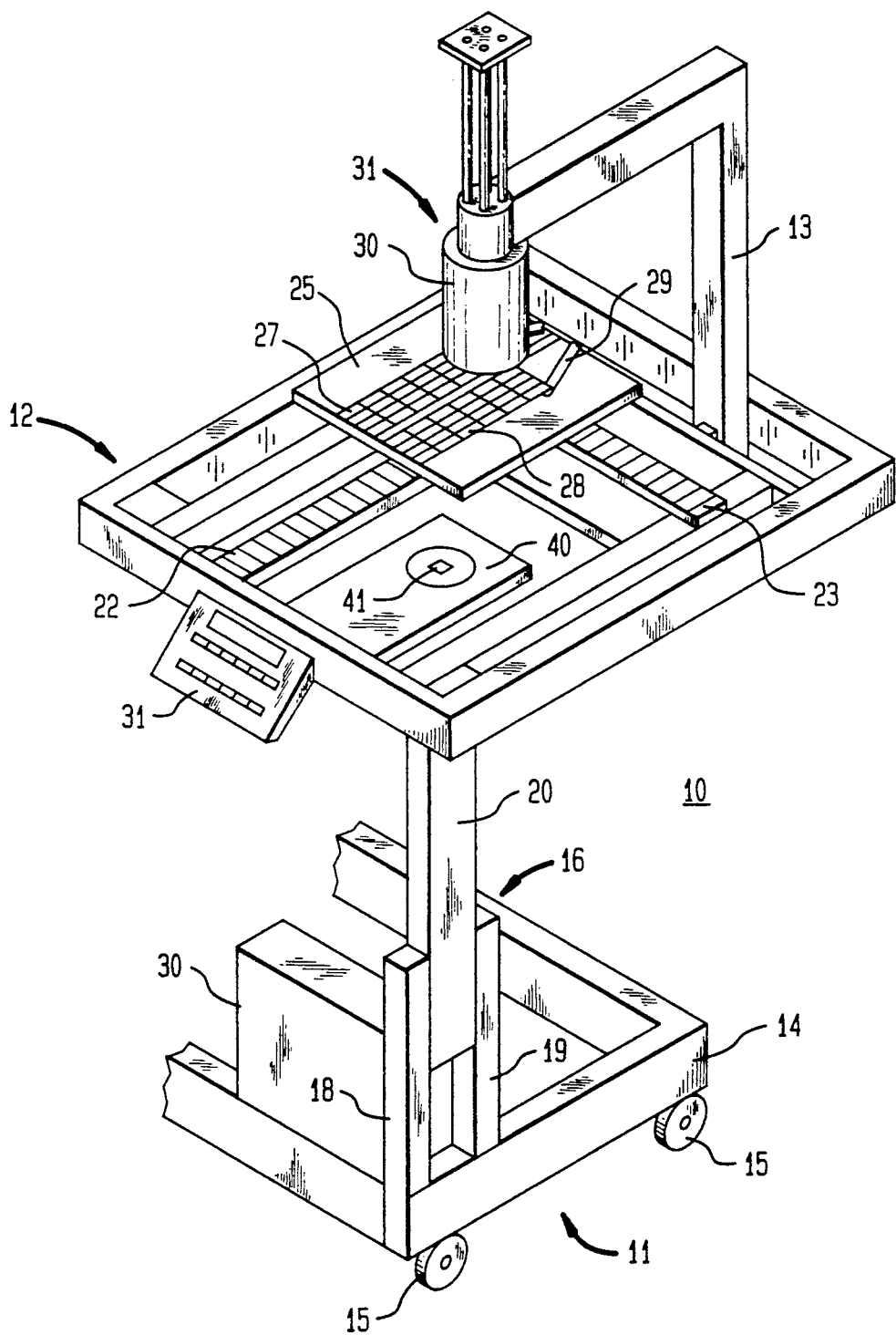
FIG. 1 is a simplified, partially fragmented isometric representation of a handler system constructed in accordance with the principles of the invention.

FIG. 1 is a simplified, partially fragmented and partially schematic isometric representation of a handler system 10 constructed in accordance with the principles of the invention. As shown, handler system 10 is formed of a support base 11 which supports a frame base 12, from which extends upwardly a head support arm 13. Support base 11 is shown in partially fragmented form and is provided with a base frame 14 supported on casters 15. Support base 11 is further provided with an adjustable height arrangement 16 which is formed of a pair upright members 18 and 19 which accommodate therebetween a member 20 which is coupled to frame base 12. Member 20 is movable between upright members 18 and 19 so as to permit adjustment of the height of frame base 12. Such adjustability of the height permits the handler system to be employed in conjunction with a manipulator (not shown) which can be provided from other manufacturers. The manipulator (not shown) would be accommodated beneath frame base 12, by virtue of the cantilever construction formed between support base 11, adjustable height arrangement 16, and frame base 12.

Frame base 12 has installed thereon a pair of orthogonally arranged linear motor platens. Linear motor platens 22 and 23 are commercially available, illustratively from the Compumotor Division of the Parker Hannifin Company, specifically as part of their model 4000 linear stepper system. The platens operate in combination with a forcer (not shown) which, in this embodiment of the invention, is installed beneath an x-y platform 25. x-y platform 25 has installed thereon two integrated chip trays 27 and 28 which, during operation of the system, are secured to the platform by operation of clamp members 29. The motion of x-y platform 25 is controlled by a commercially available computer 30, which contains information which may be accessed via a control panel 31.

A z-translatable head 30 is installed on head support arm 13. Head 30 is provided, in this embodiment, with a vacuum chuck (not shown in this figure) and a chip gripper assembly (also not shown in this figure). The translatable head is limited to move only up and down, thereby enabling the achievement of very high precision with respect to undesired displacement in the x or y direction caused by poor manufacturing tolerances, wear, or backlash. In one embodiment, the z-axis translation is performed by a pneumatically controlled slider system 31.

Beneath x-y platform 25 is disposed a tester arrangement 40 having a test socket 41 for receiving the chips to be tested, one at a time. In operation, x-y platform 25 is moved so that a chip desired to be tested is arranged immediately below z-translatable head 30. The head is urged downwardly and achieves communication via a vacuum chuck, as will be discussed hereinbelow with respect to FIG. 2. The chip is moved upward, and the x-y platform is moved so as to permit head 30 to be moved below the plane of x-y platform 25, and to test arrangement 40. Since z-translatable head 30 moves only upward and downward, it will achieve good alignment with test socket 41, whereby the chip is placed in electrical communication with the tester arrangement. 40 Upon completion of the test, the chip is removed from socket 41 and raised above the height of x-y platform 25. In this embodiment, if the chip passed the test, the x-y platform is moved to the same position it was originally, and the chip is deposited back into the same location in tray 28. On the other hand, if the chip fails the test, x-y platform 25 is moved so as to place a location on tray 27 immediately below the raised chip, and the chip is deposited into that tray. Thus, tray 27 contains only the failed chips.

Figure 2:
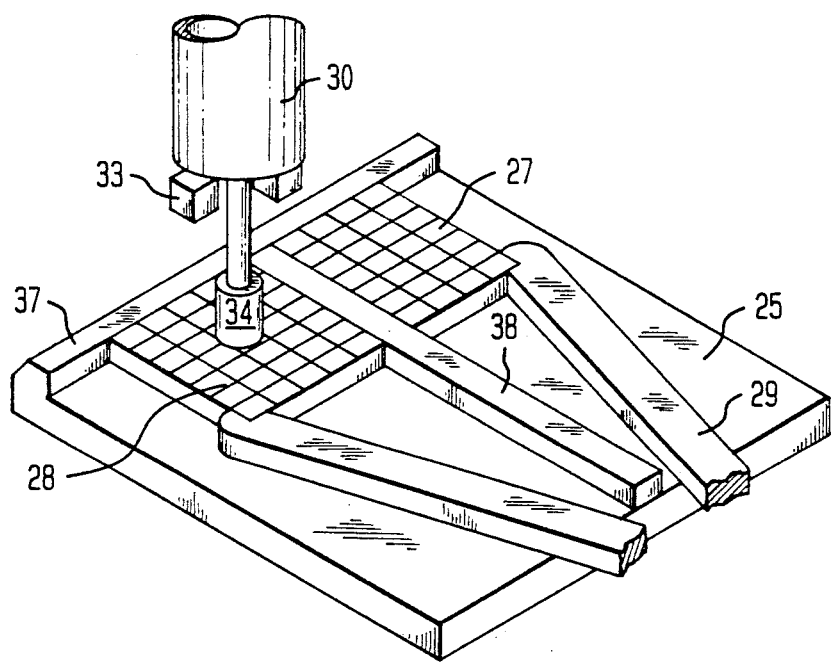
FIG. 2 is a simplified schematic representation of the pick-up head, in relationship to a movable platform and two integrated circuit chip trays clamped thereon.

FIG. 2 is a partially fragmented, simplified representation of z-translatable head 30, showing chip gripper arrangement 33 and a vacuum chuck 34. This figure additionally shows reject tray 27 and supply tray 28 secured by means of clamp 29 to x-y platform 25. As shown, the trays are urged against stops 37 and 38, and thereby maintain a fixed relationship with respect to the platform. Clamp members 29 may be operated automatically as a process control step, or may be manually operated.

As shown in FIG. 2, z-translatable head 30 is lowered to the vicinity of the chips (not specifically shown) on tray 28. Vacuum chuck 34 descends for a short distance, illustratively of one inch, and communicates with the selected chip to be tested. The suction force secures the chip to the vacuum chuck in a known manner, and the vacuum chuck is then retracted so that the chip is then gripped by chip gripper arrangement 33. As previously indicated, the x-y platform is then moved away from beneath the head, and the chip is translated downwardly to the test arrangement (not shown in this figure). When the chip is returned either to tray 28 or rejected onto tray 27, vacuum chuck 34 may provide a small blast of air which will ensure disengagement between the vacuum chuck and the chip.

As is evident from FIG. 1, handler system 10 has an open construction which affords a number of conveniences. For example, access to all major components is facilitated, thereby enabling rapid and inexpensive maintenance and clearance of jammed chips. In addition, as previous noted, the open structure facilitates the installation of the handler system over a manipulator (not shown) available commercially from a number of sources.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A circuit handler system for providing an electrical device to a test site where same is subjected to a test procedure, and removing same therefrom, the handler system comprising:

programmable horizontal platform means for supporting on a top surface thereof a tray containing a plurality of the electrical devices, said programmable horizontal platform means being controllably movable in a substantially horizontal plane along first and second axes of motion;

carrier means for moving exclusively along a third axis of motion, said third axis of motion being transverse to, and fixed with respect to, said first and second axes of motion and extending above and below said substantially horizontal plane, said programmable horizontal platform means being movable to intersect said third axis of motion;

test means for communicating electrically with said plurality of the electrical devices, said test means being arranged in the vicinity of said third axis of motion below said programmable horizontal platform means, said test means having associated therewith an electrical contact for effecting said electrical communication; and holder means coupled to said carrier means for engaging with selected ones of the electrical devices, removing said electrical devices from said tray, conveying said electrical devices to said test means, and returning said electrical devices to said tray.

2. The circuit handler system of claim 1 wherein there is further provided:

computer means having a memory for containing information corresponding to the dimensions of said tray and subdivisions thereof where the electrical devices are located thereon; and input-output means for enabling a human operator to communicate with said computer means.

3. The circuit handler system of claim 2 wherein there is further provided horizontal drive means coupled to said programmable horizontal platform means for driving same along said first and second axes of motion in response to said computer means.

4. The circuit handler system of claim 3 wherein said drive means comprises a linear stepping motor for producing a linear displacement responsive to said computer means.

5. The circuit handler system of claim 2 wherein there is further provided third axis drive means coupled to said carrier means for driving same along said third axis of motion in response to said computer means.

6. The circuit handler system of claim 2 wherein said computer means is provided with additional memory for containing information corresponding to the dimensions of a reject tray and subdivisions thereof where ones of the electrical devices which are rejected in response to said test means are delivered thereto.

7. The circuit handler system of claim 1 wherein there is further provided subcarrier means coupled to said carrier means and said holder for displacing said holder means with respect to said carrier means.

8. The circuit handler system of claim 7 wherein said subcarrier means displaces said holder means in a direction which is substantially parallel to said third axis of motion.

9. The circuit handler system of claim 1 wherein said holder means further comprises a vacuum chuck for coupling with said electrical devices.

10. A method of operating a circuit package handler system for effecting batch testing of circuit packages, the method comprising the steps of:
    first moving a first tray containing a batch of the circuit packages to be tested in a substantially horizontal plane until a first location of the first tray which contains a first selected circuit package to be tested is disposed in a path of travel of a carrier, the path of travel of the carrier being transverse to the substantially horizontal plane and fixed with respect thereto;
    first displacing the carrier along the path of travel in a first direction toward the substantially horizontal plane;
    engaging the first selected circuit package to be tested with the carrier;
    second displacing the carrier with the first engaged circuit package along the path of travel in a second direction opposite to the first direction of travel;
    second moving the first tray until is clear of the path of travel of the carrier;
    third displacing the carrier with the first engaged circuit package along the path of travel in the first direction toward the substantially horizontal plane and to an extent beyond the intersection of the transverse path of travel and the substantially horizontal plane, and to the vicinity of a test arrangement;
    first urging the first engaged circuit package into communication with the test arrangement;
    second urging the first engaged circuit package to be released from the test arrangement; and
    fourth displacing the carrier with the engaged circuit package along the transverse path of travel in the second direction of travel toward the substantially horizontal plane and to an extent beyond the intersection of the transverse path of travel and the substantially horizontal plane.

11. The method of claim 10 wherein there are further provided the steps of:
    third moving the first tray whereby the first location of the first tray is interposed in the path of travel of the carrier;
    fourth displacing the carrier with the first engaged circuit package along the transverse path of travel in the first direction toward the substantially horizontal plane and to an extent which is short of the intersection of the path of travel of the carrier and the substantially horizontal plane; and
    depositing the first engaged circuit package into the first location of the first tray.

12. The method of claim 10 wherein there are further provided the steps of:
    moving a second tray whereby a first location of the second tray is interposed in the path of travel of the carrier;
    fourth displacing the carrier with the first engaged circuit package along the transverse path of travel in the first direction toward the substantially horizontal plane and to an extent which is short of the intersection of the path of travel and the substantially horizontal plane; and
    depositing the first engaged circuit package into the first location of the second tray.

13. The method of claim 12 wherein intermediate of the steps of first and second urging there is provided the further step of holding the engaged circuit package in communication with the test arrangement during performance of the test procedure.

14. The method of claim 12 wherein said step of moving the second tray is responsive to a test result obtained in response to a test procedure performed after said step of first urging.

15. The method of claim 10 wherein said step of engaging comprises the further steps of:
    extending a vacuum chuck from the carrier toward the first location of the first tray, which contains the first selected circuit package to be tested; and
    applying a suction force from the vacuum chuck to the first selected circuit package.

16. A method of operating a circuit package handler system for effecting batch testing of circuit packages, the method comprising the steps of:
    first moving a platform having a first category tray containing a plurality of circuit packages to be tested and a second category tray containing spaces for accommodating ones of the plurality of circuit packages which are determined after the performance of the test thereon to belong in a second category;
    removing a selected circuit package from the first category tray along a fixed linear axis of travel;
    delivering the selected circuit package to a test station by moving same along the fixed linear axis of travel; and
    returning the selected circuit package to a selected one of the first category tray and the second category tray along the fixed linear axis of travel, the selection between the first category tray and the second category tray being made in response to a result obtained from the test performed at the test station.

17. The method of claim 16 wherein said step of removing comprises the further step of engaging the selected circuit package with a vacuum chuck.

18. The method of claim 16 wherein there is further provided the step of moving a holder arm installed on the first moving platform for securing the first category and second category trays thereto.

19. The method of claim 16 wherein there is further provided the step of operating a computer to control said step of first moving.

20. The method of claim 19 wherein said step of operating comprises the further step of selecting data stored in the computer corresponding to the dimensions of the first category and second category trays.

* * * * *